United States Patent [19]

D'Amato

[11] Patent Number: 5,247,953
[45] Date of Patent: Sep. 28, 1993

[54] WELLED SUMP FOR USE IN CHEMICAL PROCESS MACHINERY

[75] Inventor: Mark D'Amato, Montreal, Canada

[73] Assignee: D.E.M. Controls of Canada, Montreal, Canada

[21] Appl. No.: 836,173

[22] Filed: Feb. 12, 1992

Related U.S. Application Data

[63] Continuation of Ser. No. 376,301, Jul. 6, 1989, abandoned.

[51] Int. Cl.$^5$ ............................................. B08B 3/02
[52] U.S. Cl. ................................... 134/104.2; 134/200; 134/183; 134/186; 51/424; 51/321
[58] Field of Search ................... 134/110, 104.2, 111, 134/155, 182, 200, 131, 183, 104.3, 104.1, 186; 220/400, 410, 420; 51/324, 424, 426, 321

[56] References Cited

U.S. PATENT DOCUMENTS

| | | | |
|---|---|---|---|
| 553,677 | 1/1896 | Hoyt | 134/183 X |
| 1,521,989 | 1/1925 | Bergstrom | 134/111 |
| 1,941,660 | 1/1934 | Collins | 134/58 D |
| 1,941,922 | 1/1934 | Worth | 220/410 X |
| 2,139,096 | 12/1938 | Piquerez | 134/111 |
| 2,429,742 | 10/1947 | Barnes | 51/321 X |
| 2,575,246 | 11/1951 | Carlstedt | 134/57 D X |
| 2,711,978 | 6/1955 | Groom | 134/182 |
| 3,103,765 | 9/1963 | Nolan | 54/426 X |
| 3,177,095 | 4/1965 | Gibson | 134/183 X |
| 3,237,351 | 3/1966 | Millniser | 51/424 X |
| 3,277,907 | 10/1966 | Goldman | 134/111 X |
| 3,323,159 | 6/1967 | Ummel et al. | 134/110 |
| 3,352,063 | 11/1967 | Eppler | 51/426 |
| 3,553,895 | 1/1971 | Power | 51/321 |
| 3,776,800 | 12/1973 | Goffredo et al. | 134/111 X |
| 3,881,209 | 5/1975 | Reinitz et al. | 134/183 X |
| 3,965,914 | 6/1976 | Walker | 134/104.4 |
| 3,978,232 | 8/1976 | Dodsworth et al. | 220/410 X |
| 4,384,849 | 5/1983 | Marchetti | 134/130 |
| 4,805,649 | 2/1989 | Nezworski | 134/111 |

*Primary Examiner*—Frankie L. Stinson

[57] ABSTRACT

A fluid collector positionable beneath a fluid sprayer, said collector comprising a fluid receiving surface having at least one concave collection well formed therein. A preferred embodiment of the collector comprises a dual welled insert positionable within an existing catch tank or sump, said insert having first and second collection wells with a raised bulkhead or septum formed therebetween. A solution or suspension rolling down the sloped surface of the dual welled insert will be separated on either side of the raised bulkhead or septum so that a first portion of the fluid will collect in the first collection well and a second portion of the fluid will collect in the second collection well. Each collection well is of generally smooth configuration and devoid of sharp corners so as to eliminate the formation of fluid retentive dead zones therein, thereby making the fluid contained in each collection well available for complete and efficient recirculation without substantial hangup of fluid within the collection well.

31 Claims, 2 Drawing Sheets

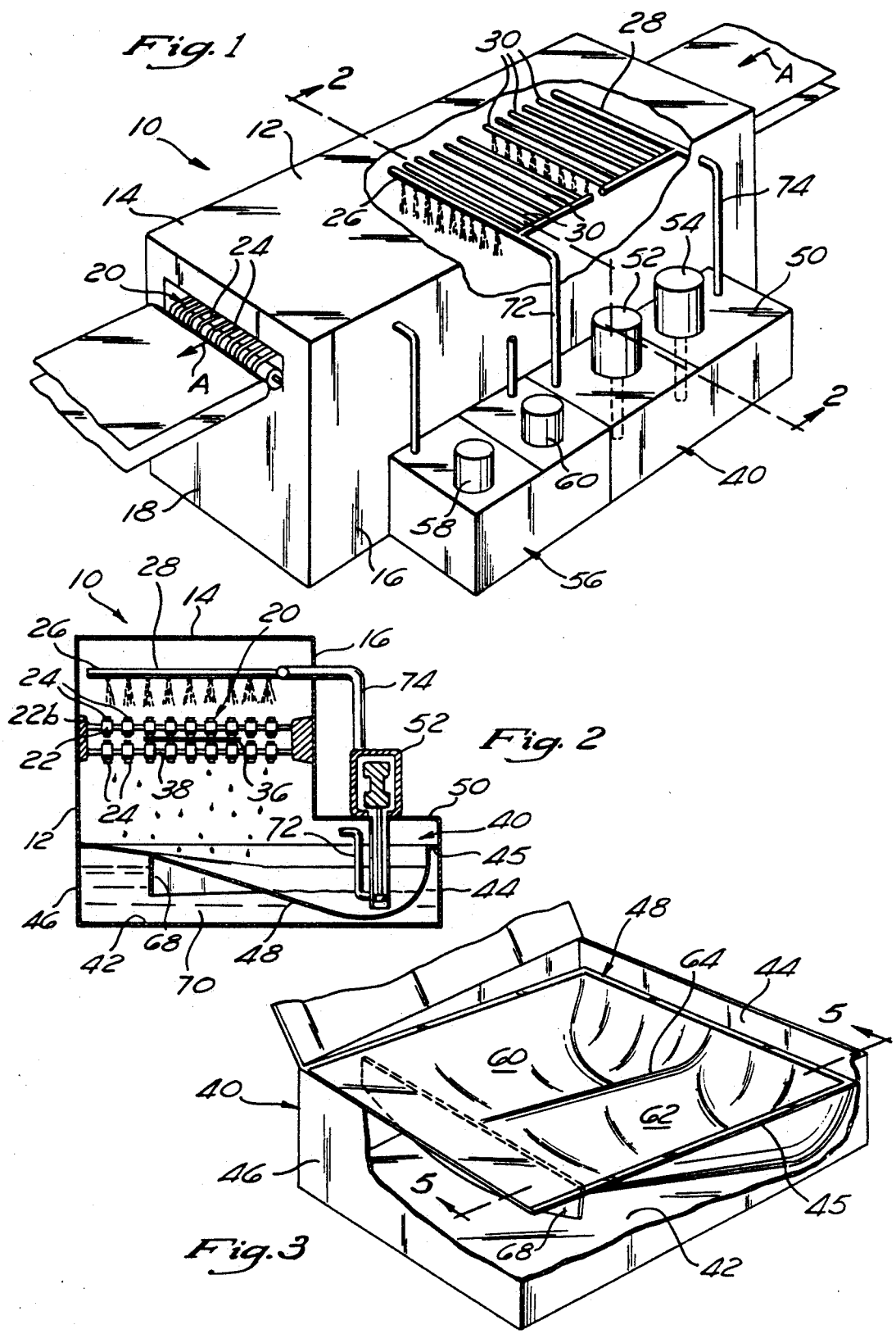

WELLED SUMP FOR USE IN CHEMICAL PROCESS MACHINERY

This is a continuation of Ser. No. 07/376,301, filed Jul. 6, 1989, now abandoned.

BACKGROUND OF THE INVENTION

The present invention pertains generally to chemical process technology and more particularly to a fluid collector having one or more fluid collection wells formed therein, said collector being positionable beneath a sprayer and/or within an existing fluid collecting tank or sump so as to facilitate continuous and complete mixing and/or recirculation of a liquid chemical, solution or suspension held therein.

The fluid collector of the present invention is particularly useful in chemical process machines used in the manufacture of printed circuit boards and will be described herein with particular reference thereto. It will be appreciated, however, that the fluid collector of the present invention may be usable in connection with many types of chemical process machines in addition to those employed in circuit board manufacturing applications.

It is common practice in the field of electronic circuit board manufacturing to employ conveyorized, spray process machines wherein one or more liquid chemicals, suspensions, or solutions are spray applied to circuit boards as they pass along a fixed conveyor path. Considerations of economy normally require that the liquid chemical, suspension or solution be recirculated and reused numerous times until such liquid chemical, solution or suspension has become chemically exhausted, contaminated or otherwise no longer usable. Typical spray process machines used in such applications generally comprise one or more mechanical conveyors having sprayer heads or nozzles positioned above and/or below the conveyor so as to spray apply the desired chemical solutions and/or suspensions to the circuit boards as they more along the conveyor path. A sump or catch tank is positioned below the conveyor to catch the runoff liquid chemical, solution and/or suspension after it has been spray applied to the passing circuit boards. The solution and/or suspension is accumulated within the sump or catch tank and is then taken up by one or more pumps, recirculated to the spray heads/spray nozzles wherefrom it is resprayed upon the conveyor path.

The use of standard spray processing machinery with certain suspensions or slurries is problematic. For example, when unstable suspensions (e.g. a slurry of pumice particles within a liquid matrix) are employed, it is generally desirable to maintain such suspensions under substantially continuous motion to prevent settling and separation of particulate matter. Many sumps are, however, not properly designed to permit the continuous, motion necessary to hold the material in suspension. Typical fluid collection sumps (e.g. rectangular fluid bins or cylindrical tanks) incorporate sharp corners or "dead zones" wherein the suspension may settle out and cake. Such settling out and caking is undesirable in that it results in a diminution in the concentration of solid particulate matter contained in the recirculating suspension/slurry and, further, because it complicates emptying and cleaning the sump interior.

The use of certain liquid chemicals or solutions in standard collection sumps may also be problematic. For instance, solutions which tend to form percipitates or chemicals which require substantial oxygenation may tend to form such percipitate or become oxygen depleted if allowed to stand within sharp corners or dead zones of the sump without periodic recirculation, turnover and/or aeration. Such percipitate formation or oxygen depletion may result in diminished reactivity of the solution or processing problems due to the clogging of certain machine components with solid percipitant matter.

Thus, there remains a need in the art for an improved sump or tank configuration which will permit efficient, complete recirculation and mixing of liquids, suspensions or solutions without permitting such liquids to stand idle or become trapped within grooves, corners or other specific areas of the sump.

SUMMARY OF THE INVENTION

The present invention comprises a fluid collector positionable beneath a fluid sprayer to facilitate collection, recirculation and turnover of liquid solution or suspension emanating from the sprayer. The collector of the prsent invention generally comprises a pan-like collector which may be formed as an insert positionable within a fluid collection sump or tank. Such insert comprises a generally sloped fluid receiving surface having one or more smooth surfaced, bowl-like wells or holding compartments formed therein, so that fluid falling upon the fluid collecting surface will run downwardly into such well(s). Each bowl-like well is devoid of sharp corners, ridges or other regions wherein solution or suspension may become locked or retained as would prevent subsequent aspiration, removal and recirculation thereof (e.g. "dead zones"). The elimination of such dead zones prevents fluid from becoming trapped or standing within specific regions of the wells.

The upper fluid-receiving surface of the collector acts as one or more chutes or slides upon which liquid and/or suspension may run downwardly into the collecting well(s) formed therein. The rolling or sliding of the liquid solution or suspension down such chutes or slides causes some mixing, thereby helping to maintain homogeneity of the liquid, solution or suspension. One or more pumps will be fluidly connected to each of the wells to continually pump the collected liquid, solution or suspension therefrom, thereby providing for complete recirculation of the liquid/suspension.

It is desirable that the operational throughput of the pump(s) employed for withdrawing fluid from each containment well be coordinated with the volume of fluid held within that containment well so as to ensure sufficient turnover of fluid within the well.

Further, in accordance with the invention, the collector may be in the form of a welled tank insert made of molded plastic such as fiberglass reinforced plastic or vacuum formed PVC sheet.

To facilitate placement of the welled insert into a standard fluid bin or sump, the underside of the insert is provided with one or more fins, members or feet to facilitate positioning and stable placement of the insert within a desired fluid bin or sump.

A quantity of water or other heat absorbing or imparting medium may be placed in the space between the underside of the insert and the surrounding fluid collection bin or sump. Such water or other heat absorbing medium will typically be used to extract undesirable heat from a pumice slurry or other material which has become unnecessarily warm due to friction. Conversely, however, the water or other medium may be purposely heated so as to bring about warming of the solution or suspension contained within the holding wells of the insert.

The term fluid as used herein shall pertain to suspensions and slurries as well as liquid solutions and other substances typically referred to as fluids.

Further objects and advantages of the invention will become apparent to those skilled in the art upon reading and understanding of the following detailed description of a preferred embodiment and consideration of the accompanying drawings.

BRIEF DESCRIPTION OF THE DRAWINGS

FIG. 1 is perspective view of a conveyorized spray process machine in the nature of a circuit board pumice scrubber having a dual welled sump insert of the present invention positioned therein.

FIG. 2 is a cross-sectional view through line 2—2 of FIG. 1.

FIG. 3 is a cutaway perspective view of a standard fluid collection sump having a dual welled insert of the present invention positioned therein.

DETAILED DESCRIPTION OF A PREFERRED EMBODIMENT

Figure 4:
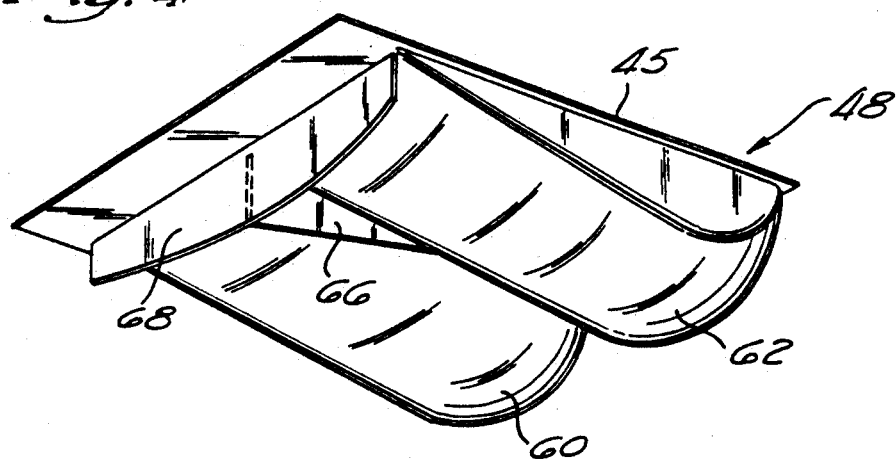
FIG. 4 is a perspective view of the underside of a dual welled sump insert of the present invention.

The following detailed description and the accompanying drawings are provided for purposes of illustrating and explaining a presently preferred embodiment of the invention and are not intended to limit the scope of the invention in any way.

Referring to the drawings, FIG. 1 shows a cutaway perspective view of a conveyorized spray process machine 10 in the nature of a pumice scrubbing machine used in the manufacture of printed circuit boards. For purposes of this detailed description, the processing machine 10 will be described as a pumice scrubbing machine operative to spray a pumice slurry onto circuit boards as they pass along a conveyor. It will be appreciated, however, that the invention is usable in connection with many types of machinery wherein various liquid chemical solutions and/or suspensions are pumped or recirculated.

The pumice scrubbing machine 10 shown comprises a generally rectangular housing or enclosure 12 having a top panel 14, side panels 16 and end panels 18. A conveyor 20 extends longitudinally through the housing 10 and serves to transport workpieces such as printed circuit boards through the housing enclosure 12 in the direction of arrows A. The conveyor 20 may comprise any type of conveyor assembly, including but not limited to standard belt or opposed roller type conveyors and the like. For purposes of this detailed description, however, the conveyor 20 shown in the drawings comprises a plurality of revolving plastic straps arranged in staggered relationship to one another so as to convey the workpieces through the housing 10 without continually covering or preventing the spray from impinging against any portion of the workpiece.

The conveyor 20, as shown, consists of a series of pulleys or rollers 22 extending transversely within housing enclosure 12. A plurality of plastic bands or straps 24 extend around the rollers and pulleys 22 so as to form a continuous series of revolving belt or strap type conveyor assemblies. In many circuit board applications upper and lower conveyor assemblies of the aforementioned type are employed and the circuit boards, or portions thereof are passed between opposing upper and lower belts or straps 24.

An abrasive pumice slurry (e.g. amorphorous pumice particles suspended in water) is maintained in continual suspension and sprayed downwardly upon circuit boards as they pass along the conveyor path Such spraying is accomplished by passing pressurized pumice slurry into spray manifolds 26, 28. Each spray manifold 26, 28 consists of a plurality of transverse pipe members 30 which extend transversely within the interior of the enclosure 12 above the conveyor 20. Of course, additional lower spray manifolds may be positioned beneath the conveyor 20 for purposes of spraying upwardly on the passing circuit boards as well. However, in this schematic showing, only upper manifolds 26, 28 are shown.

As depicted in the operational schematic of FIG. 2, a circuit board 36 is passed between an upper conveyor comprising roller 22b having belts 24 disposed thereon and a lower conveyor comprising roller 38 having similar belts 24 disposed thereon. As the circuit board 36 passes along conveyor 20 beneath spray manifold 28, the spray emanating from manifold 28 passes between belts 24 and impinges against the exposed surfaces of circuit board 36. Of course, the belts 24 may be staggered or otherwise arranged so that the pumice spray will make contact with the entire surface of the circuit board 36 as it passes beneath manifolds 26, 28. After the suspension has sprayed upon the circuit board 36 the runoff suspension falls into underlying sump 40.

Sump 40 comprises the generally rectangular fluid collection bin having a floor 42 and front 44 and back 46 sides. As shown, the front portion of the sump extends out of and beyond the front wall 16 of the machine housing 12. The portion of the sump 40 which extends beyond the front side 16 is covered by top cover 50.

In the embodiment shown in FIG. 1, a separate water sump 56, having water pumps 58 and 60 mounted therein is positioned next to the slurry sump 40 wherein the sump insert 48 of the present invention is positioned. Such adjacent water sump 56 is utilized for the recirculation of rinse water and does not interconnect with or form a part of the slurry sump 40.

Figure 5:
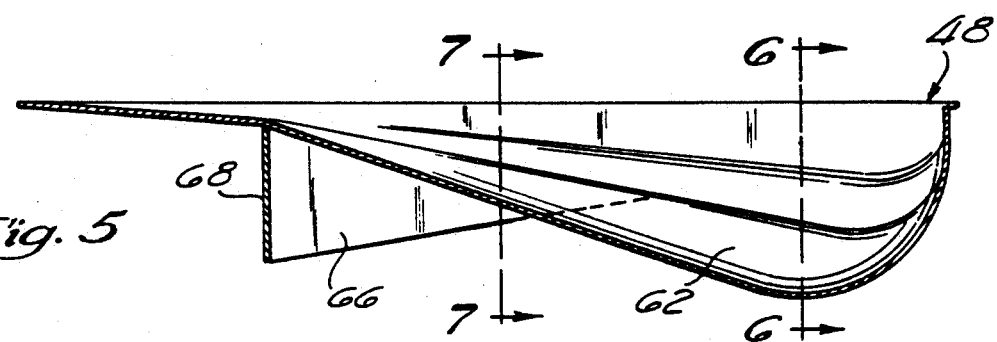
FIG. 5 is an elevational sectional view taken through line 5—5 of FIG. 3.
Figure 6:
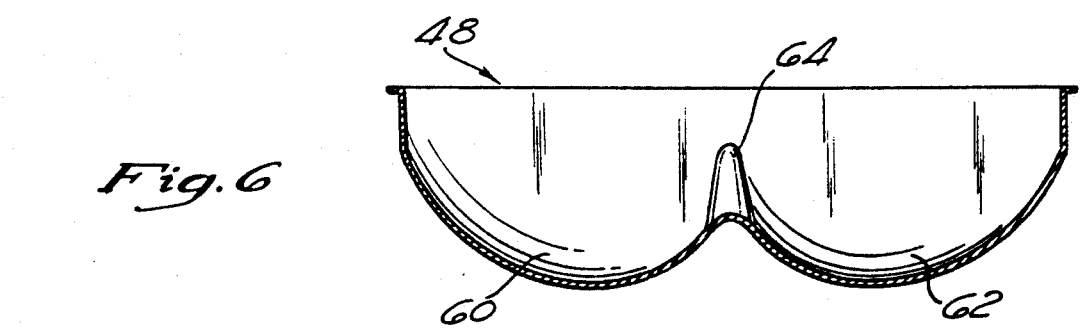
FIG. 6 is an elevational sectional view taken through line 6—6 of FIG. 5.
Figure 7:
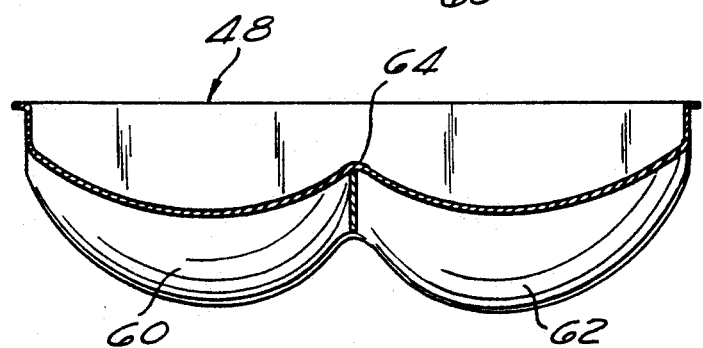
FIG. 7 is an elevational sectional view taken through line 7—7 of FIG. 5.

As shown, a collector, such as the dual welled sump insert 48 shown in FIGS. 2-7 of the present invention is sized and configured to be slideably positionable within the interior of the rectangular slurry sump 40. The insert 48 is preferably formed of molded reinforced plastic (e.g. fiberglass reinforced FRP or vacuum molded PVC sheet) or other material which is substantially resistant to the effects of the pumice slurry or other chemicals held therein.

The dual welled sump insert 48 comprises a first collection well 60 and a second collection well 62. A raised bulkhead or septum 64 separates the first well 60 from the second well 62. The septum 64 is configured such that runoff suspension or slurry falling into the shallow end of the dual well insert 48 will run downwardly over the sloped upper surface of the insert 48 and will be divided or separated by septum 64, thereby causing a first portion of such runoff material to collect within well 60 while a second portion of such runoff material will collect within well 62.

The sloped contours of the insert upper surface and septum 64 are configured such that the collected solution, suspension or fluid will roll or mix as it slides down the sloping surfaces, thereby becomming mixed and/or aerated while bifurcating into separate streams on opposite sides of the septum or bulkhead 64.

The individual wells 60, 62 are specifically sized to contain only so much material as may be efficiently pumped and recirculated by pumps 52, 54. Or, conversely, the pumps 52, 54 are sized to effectively dump and recirculate the amount of fluid contained within the wells 60, 62. Furthermore, the inner surfaces at the collection wells 60, 62 are sized and shaped so there is maintained a continual turnover of material within the wells 60, 62 as to prevent any dead zone or still areas wherein settling or separation may occur. Consequently a steady state flow condition is maintained within the insert to keep the fluid in the desired state, e.g. in solution.

Lip 45 is formed around the perimeter of the insert 48 and may engage corresponding structures formed on the inner walls of the sump to hold the insert in its desired position therewithin. Alternatively various structures formed on the underside of the insert 48 may also be used to position and stabilize the insert 48. For example, the bulbous undersides of the first and second wells 60, 62 extend downwardly and provide suitable resting points for the insert on the underlying tank floor. Additionally, stabilizing members 66 and 68 are provided to further support and stabilize the insert 48.

Member 66 extends downwardly from the approximate transverse mid-line of the insert 48, while member 68 extends downwardly along a longitudinal axis near the shallow end of the insert 48. Member 66 abuts against the side of member 68 in substantially perpendicular relationship thereto

OPERATION OF THE PREFERRED EMBODIMENT

The preferred dual welled sump insert described herein is preferably inserted into the generally rectangular fluid bin or sump of a pumice scrubber machine or similar device. A quantity of water or other coolant liquid fills at least part of the space between the underside of the insert 48 and the walls 42, 44, 46 of the fluid bin or sump 40. Such water or coolant liquid will bathe the underside of the dual welled insert 40, thereby extracting heat from the recirculating solution, suspension or slurry contained within the wells 60, 62 of the insert 48. The provision of such water or other liquid coolant 70 is particularly important in pumice scrubber applications because the pumice slurry becomes substantially warmed by the continual pumping recirculation and impingement of the pumice particles against the solid surfaces Accordingly, the dual welled insert 48 is positioned within sump 40 such that the shallow end of the insert abuts the rear wall 46 of the sump and the deep end of the insert 48 abuts the front wall of the sump 40. A quantity of water or other heat exchange medium 70 is placed in the space between the underside of the insert 48 and the inner walls of the sump 40. A quantity of a desired solution, suspension or slurry (e.g. the pumice slurry described in relation to the pumice scrubber application) is placed in each of the dual wells 60, 62 of the insert 48. Pumps 52, 54 are energized and the solution, suspension or slurry is pumped from the wells 60, 62 through supply lines 72, 74 and into spray manifolds 26, 28. The solution, suspension or slurry is then sprayed downardly through nozzles mounted on manifolds 26, 28 such that the solution, suspension or slurry will strike circuit boards 36 passing along conveyor 20. The solution, suspension or slurry will then run off the conveyor 20 and circuit board 36, into the shallow end and mid-portion of insert 48. The solution, suspension or slurry striking the shallow end or mid-portion of the insert 48 will then run downwardly, being separated or divided into separate streams by septum 64 and into wells 60, 62, where such recollected solution, suspension or slurry will again be recirculated via pumps 52, 54, lines 72, 74 and spray manifolds 26, 28.

Although the present invention has been described herein with a particular reference to a presently preferred, dual welled embodiment it will be appreciated by those skilled in that art that various conditions, modifications and alterations may be made to such embodiment without departing from the spirit and scope of the invention. For example, any number of independent wells, divided by individual septums, may be utilized to form multi-welled tank inserts in accordance with the present invention. For example, a tri-well insert of the present invention would have a first septum dividing the first and second wells and a second septum dividing the second and third wells. Accordingly, various types of single and multi-welled tank inserts are clearly within the scope of the present invention. Additionally, individual pumps need not be mounted in each and every collection well as shown in the drawings. Instead, a single pump may be employed with multiple pipes connecting the pump to the multiple wells of the insert. Accordingly, it is intended that the above recited additions, deletions and/or modifications, and others, be included within the scope of the appended claims and the equivalents thereof.

What is claimed is:

1. A fluid collector positionable beneath a fluid sprayer for receiving a volume of fluid discharged from the above-positioned sprayer, the collector being in fluid communication with a pump operative to return the collected fluid to the sprayer, the collector comprising:

an insert positionable within an existing fluid sump having a sloped fluid-receiving surface for receiving fluid discharge from the sprayer; and at least one sloped collection well formed in said sloped fluid receiving surface, said collection well being of concave configuration and devoid of sharp corners and being formed and sized in relation to the volume and composition of fluid discharged by the sprayer and circulated by said pump such that the slopes of said collection well facilitate lateral and longitudinal movement of the fluid to impart sufficient turbulent motion to said fluid to maintain the fluid in a desired state as the fluid traverses the sloped collection well.

2. The collector of claim 1 wherein said insert is generally rectangular in configuration so as to be positionable within a generally rectangular fluid sump.

3. The collector of claim 1 wherein said at least one collection well comprises first and second collection wells having a sloped septum extending upwardly between said first and second collection wells.

4. The collector of claim 1 wherein said at least one collection well comprises a plurality of individual collection wells having a plurality of sloped septa extending upwardly between said plurality of collection wells.

5. The collector of claim 1 wherein said collector is formed of molded plastic.

6. The collector of claim 1 wherein said collector is formed of fiberglass reinforced plastic.

7. The collector of claim 1 wherein said collector is formed of vacuum formed polyvinyl chloride.

8. The collector of claim 1 wherein said insert further comprises at least one mounting member operative to facilitate stable positioning of said insert within an existing fluid sump.

9. The collector of claim 8 wherein said at least one mounting member comprises at least one lip-like flange formed around said insert.

10. The collector of claim 8 wherein said at least one mounting member comprises at least one member extending downwardly from said insert.

11. The collector of claim 1 wherein the fluid emanating from said sprayer comprises a suspension of solid particles within a liquid matrix, the desired state of said suspension being one of homogeneity, the turbulent motion imparted to the fluid by the slopes of said collection well being operative to maintain said solid particles in a homogenous suspension within said liquid matrix.

12. The collector of claim 1 wherein the fluid emanating from said sprayer comprises a solution which tends to form a precipitate if permitted to stand motionless, the desired state of said solution being a precipitate-free solution, the turbulent motion imparted to the fluid by the slopes of said collection well being operative to maintain said solution in sufficient motion to prevent the formation of said precipitate.

13. The collector of claim 1 wherein the fluid emanating from said sprayer comprises a solution, the desired state of which is one of sufficient oxygenation, the turbulent motion imparted to the fluid by the slopes of said collection well being effective to allow complete and sufficient aeration of said solution to effect a desired level of oxygenation thereof.

14. The collector of claim 1 wherein the collection well is configured so that the deepest region of said collection well is near the center thereof and wherein the fluid communication between said pump and said collector comprises a drop pipe extending downwardly into said collection well near the bottom of the deepest point thereof so as to facilitate effective pumping of said fluid from said collection well.

15. The collector of claim 1 wherein the turbulent motion imparted to the fluid by the slopes of said collection well is operative to maintain a continuous flow path for fluids received onto said fluid collector.

16. A fluid collector positionable beneath a fluid sprayer for receiving a volume of fluid discharged from the above-positioned sprayer, the collector being in fluid communication with a pump operative to return the collected fluid to the sprayer, the collector comprising:

a sloped fluid-receiving surface for receiving fluid discharge from the sprayer;

first and second collection wells formed in said sloped fluid receiving surface, said collection well being of concave configuration and devoid of sharp corners and being formed and sized in relation to the volume and composition of fluid discharged by the sprayer and circulated by said pump such that the slopes of said collection well facilitate lateral and longitudinal movement of the fluid to impart sufficient turbulent motion to said fluid to maintain the fluid in a desired state as the fluid traverses the sloped collection well; and a septum extending upwardly from said fluid-receiving surface so as to divide at least one portion of said fluid-receiving surface into two separate chutes whereupon fluid may flow downwardly into said first and second collection wells.

17. The collector of claim 16 wherein said collector comprises an insert positionable within an existing fluid sump.

18. The collector of claim 17 wherein said insert further comprises at least one mounting member operative to facilitate stable positioning of said insert within an existing fluid sump.

19. The collector of claim 18 wherein said at least one mounting member comprises at least one lip-like flange formed around said insert.

20. The collector of claim 18 wherein said at least one mounting member comprises at least one member extending downwardly from said insert.

21. The collector of claim 16 wherein said insert is generally rectangular in configuration so as to be positionable within a generally rectangular fluid sump.

22. The collector of claim 16 wherein said collector comprises an integral part of a fluid collection sump.

23. The collector of claim 16 wherein said collector is formed of molded plastic.

24. The collector of claim 16 wherein said collector is formed of fiberglass reinforced plastic.

25. The collector of claim 16 wherein said collector is formed of vacuum formed polyvinyl chloride.

26. The collector of claim 16 wherein said at least one collection well is of generally rounded bowl-shaped configuration.

27. The collector of claim 16 wherein the fluid emanating from said sprayer comprises a suspension of solid particles within a liquid matrix, the desired state of said suspension being one of homogeneity, the turbulent motion imparted to the fluid by the slopes of said collection well being operative to maintain said solid particles in a homogenous suspension within said liquid matrix.

28. The collector of claim 16 wherein the fluid emanating from the sprayer comprises a solution which tends to form a precipitate if permitted to stand motionless, the desired state of said solution being a precipitate-free solution, the turbulent motion imparted to the fluid by the slopes of said collection well operative to maintain said solution in sufficient motion to prevent the formation of said precipitates.

29. The collector of claim 16 wherein the fluid emanating from said sprayer comprises a solution, the desired state of which is one of sufficient oxygenation, the turbulent motion imparted to the fluid by the slopes of said collection well effective to allow complete and sufficient aeration of said solution to effect a desired level of oxygenation thereof.

30. The collector of claim 16 wherein the collection well is configured so that the deepest region of said collection well is near the center thereof and wherein the fluid communication between said pump and said collector comprises a drop pipe extending downwardly into said collection well near the bottom of the deepest point thereof so as to facilitate effective pumping of said fluid from said collection well.

31. The collector of claim 16 wherein the turbulent motion imparted to the fluid by the slopes of said collection well is operative to maintain a continuous flow path for fluids received onto said fluid collector.

* * * * *